(12) United States Patent
Lee (10) Patent No.: US 11,017,844 B2
(45) Date of Patent: May 25, 2021

(54) SEMICONDUCTOR MEMORY DEVICE

(71) Applicant: SK hynix Inc., Gyeonggi-do (KR)

(72) Inventor: Wan Seob Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/712,456

(22) Filed: Dec. 12, 2019

(65) Prior Publication Data

US 2020/0372947 A1  Nov. 26, 2020

(30) Foreign Application Priority Data

May 22, 2019 (KR) .......................... 10-2019-0060193

(51) Int. Cl.
| | | |
|---|---|---|
| *G11C 7/10* | (2006.01) | |
| *G11C 11/4091* | (2006.01) | |
| *G11C 11/4094* | (2006.01) | |
| *G11C 7/06* | (2006.01) | |
| *G11C 11/4093* | (2006.01) | |

(52) U.S. Cl.
CPC .......... *G11C 11/4091* (2013.01); *G11C 7/065* (2013.01); *G11C 7/106* (2013.01); *G11C 7/1051* (2013.01); *G11C 7/1087* (2013.01); *G11C 11/4093* (2013.01); *G11C 11/4094* (2013.01)

(58) Field of Classification Search
CPC ......... G11C 16/26; G11C 7/1051; G11C 7/22; G11C 7/106; G11C 7/1087; G11C 7/065; G11C 11/4091; G11C 11/4093; G11C 11/4094
USPC .......................... 365/185.11, 185.17, 189.05
See application file for complete search history.

(56) References Cited

U.S. PATENT DOCUMENTS

| | | | | |
|---|---|---|---|---|
| 5,825,709 | A | * | 10/1998 | Kobayashi ............... G11C 7/06 365/230.03 |
| 7,184,323 | B2 | * | 2/2007 | Fujisawa .............. G11C 7/1012 365/189.05 |
| 9,424,941 | B2 | * | 8/2016 | Kim ....................... G11C 16/26 |
| 9,965,388 | B2 | * | 5/2018 | Chun ..................... G11C 16/10 |
| 10,319,416 | B2 | * | 6/2019 | Oh ......................... G11C 7/106 |
| 10,664,395 | B2 | * | 5/2020 | Oh ...................... G06F 12/0895 |

FOREIGN PATENT DOCUMENTS

| | | |
|---|---|---|
| KR | 10-2005-0011318 | 1/2005 |
| KR | 10-2017-0130969 | 11/2017 |

\* cited by examiner

*Primary Examiner* — Son L Mai
(74) *Attorney, Agent, or Firm* — IP & T Group LLP (57) ABSTRACT

A semiconductor memory device includes a cache latch group including a plurality of even latch stages and a plurality of odd latch stages arranged alternately with each other; and a sense amplifier group coupled to the cache latch group through a plurality of first bit out lines respectively corresponding to the plurality of even latch stages and through a plurality of second bit out lines respectively corresponding to the plurality of odd latch stages.

19 Claims, 8 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2019-0060193, filed on May 22, 2019, which is incorporated herein by reference in its entirety.

BACKGROUND

1. Field of Invention

Various embodiments of the present disclosure relate generally to an electronic device, and more particularly, to a semiconductor memory device.

2. Description of Related Art

Among semiconductor memory devices there are volatile memory devices and nonvolatile memory devices.

Nonvolatile memory devices may operate at relatively low write and read speeds, but may retain stored data even in the absence of a power supply. Therefore, nonvolatile memory devices may be used when stored data is to be retained regardless of supply of power. Examples of nonvolatile memory devices include Read Only Memory (ROM), Mask ROM (MROM), Programmable ROM (PROM), Erasable Programmable ROM (EPROM), Electrically Erasable Programmable ROM (EEPROM), flash memory, Phase change Random Access Memory (PRAM), Magnetic RAM (MRAM), Resistive RAM (RRAM), and Ferroelectric RAM (FRAM). Flash memory may be a NOR-type memory or a NAND-type memory.

Among nonvolatile memory devices, flash memory may have both advantages of RAM in that data is programmable and erasable and advantages of ROM in that data stored therein is retained even when the power is interrupted. Flash memory has been widely used as the storage media of portable electronic devices such as digital cameras, Personal Digital Assistants (PDAs), and MP3 players.

Recently, data input/output speed has become an important issue in the further development of storage solution products including flash memory such as a Solid State Drive/Disk (SSD), or an embedded Multi-media Card (eMMC).

SUMMARY

Various embodiments of the present invention are directed to a semiconductor memory device capable of improving the stability of a data output operation.

According to an embodiment, a semiconductor memory device may include a cache latch group including a plurality of even latch stages and a plurality of odd latch stages arranged alternately with each other; and a sense amplifier group coupled to the cache latch group through a plurality of first bit out lines respectively corresponding to the plurality of even latch stages and through a plurality of second bit out lines respectively corresponding to the plurality of odd latch stages.

According to an embodiment, a semiconductor memory device may include a memory cell array including a plurality of memory cell groups, a page buffer group configured to sense data stored in the plurality of memory cell groups, a cache latch group configured to latch data sensed by the page buffer group, the cache latch group including a plurality of even latch stages and a plurality of odd latch stages, wherein the plurality of even latch stages and the plurality of odd latch stages correspond to a plurality of bit out lines, respectively and a sense amplifier group coupled to the cache latch group through the plurality of bit out lines, and configured to sense potentials of the bit out lines and transfer sensed data to data lines.

According to an embodiment, a semiconductor memory device may include a plurality of memory banks, and a sense amplifier group configured to sense potential levels of a plurality of bit out lines that are coupled to the memory banks and transfer sensed data to data lines, wherein each of the plurality of memory banks includes a cache latch group including a plurality of even latch stages and a plurality of odd latch stages, wherein each of the plurality of even latch stages and the plurality of odd latch stages corresponds to a respective one of the plurality of bit out lines, and wherein a first data output operation of even data stored in the even latch stages overlaps with a second data output operation of odd data stored in the odd latch stages.

DETAILED DESCRIPTION

Specific structural and functional description provided herein is directed at embodiments of the present invention. However, the invention may be carried out in various forms and ways. Thus, the present invention is not limited to the disclosed embodiments.

Various modifications and changes may be applied to any of the disclosed embodiments. Thus, it is intended that the present invention includes all changes, equivalents, and substitutes that do not depart from the spirit and technical scope of the present invention.

While terms such as "first" and "second" may be used to identify various components, such components are not limited to the above terms. The above terminologies are used to distinguish one component from other component that otherwise have the same or similar names. A first component in one instance may be referred to as a second component in another instance without suggesting any substantive change in the form or function of the underlying component itself.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Other expressions describing relationships between components such as "between," "immediately between" or "adjacent to" and "directly adjacent to" may be construed similarly.

The terms used in the present application are merely used to describe particular embodiments, and are not intended to limit the present invention. Singular forms in the present disclosure are intended to include the plural forms as well, unless the context clearly indicates otherwise. In the present specification, it should be understood that open ended terms, such as "include" or "have" indicate that a stated feature, a number, a step, an operation, a component, a part or combination thereof is present, but do not exclude the possibility that one or more other features, numbers, steps, operations, components, parts or combinations thereof are present or may be added.

So far as not being differently defined, all terms used herein including technical or scientific terminologies have meanings that are commonly understood by those skilled in the art to which the present disclosure pertains. Ordinary dictionary-defined terms should be construed as having the same meanings as would be construed in the context of the related art, and unless clearly defined otherwise in this specification, should not be construed as having idealistic or overly formal meanings.

In some embodiments, well-known processes, device structures, and technologies may not be described in detail to avoid unnecessarily obscuring features and aspects of the present invention.

Below, various embodiments of the present invention are described in detail with reference to the accompanying drawings in order for those skilled in the art to be able to readily implement and practice the present invention.

Figure 1:
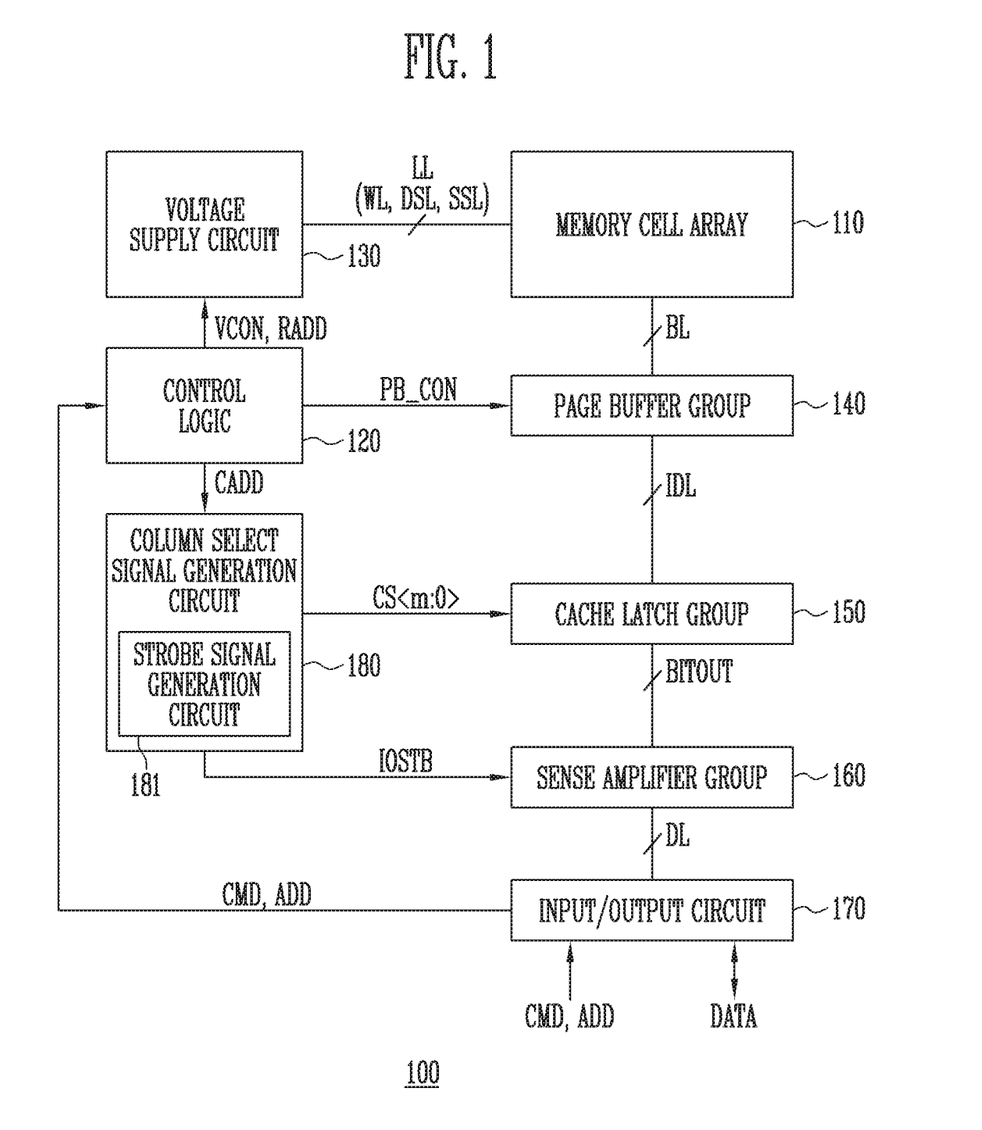
FIG. 1 is a diagram illustrating a semiconductor memory device according to an embodiment of the present invention.

FIG. 1 is a diagram illustrating a semiconductor memory device 100 according to an embodiment of the present disclosure.

Referring to FIG. 1, the semiconductor memory device 100 may include a memory cell array 110 storing data therein, peripheral circuits 130, 140, 150, 160, 170, and 180 configured to program/write data into the memory cell array 110, read and output the stored data to an external device, or erase the data from the memory cell array 110, and control logic 120 controlling the peripheral circuits 130, 140, 150, 160, 170, and 180. The peripheral circuits 130, 140, 150, 160, 170, and 180 may include a voltage supply circuit 130, a page buffer group 140, a cache latch group 150, a sense amplifier group 160, input/output circuit 170, and a column select signal generation circuit 180. By way of example, aspects of the present invention are described in the context of a read operation.

The memory cell array 110 may include a plurality of memory cells storing data therein. Local lines LL and bit lines BL may be coupled to the memory cell array 110. The local lines LL may include word lines WL coupled to the plurality of memory cells, a drain select line DSL coupled to a drain select transistor, and a source select line SSL coupled to a source select transistor. In addition, the memory cell array 110 may include a main area storing main data and a redundancy area storing repair data. The memory cell array 110 may be configured in a three-dimensional memory array in which memory cells are stacked on a substrate in a vertical direction to a surface of the substrate.

The control logic 120 may output a voltage control signal VCON to generate operating voltages necessary to perform a read operation in response to a command signal CMD input from an external device through the input/output circuit 170, and a page buffer control signal PB_CON to control page buffers included in the page buffer group 140. In addition, the control logic 120 may generate a row address signal RADD and a column address signal CADD in response to an address signal ADD input from an external device through the input/output circuit 170, output the generated row address signal RADD to the voltage supply circuit 130, and output the generated column address signal CADD to the column select signal generation circuit 180.

The voltage supply circuit 130 may generate the operating voltages for a read operation of the memory cells in response to the voltage control signal VCON from the control logic 120, and supply the operating voltages to the memory cell array 110. The voltage supply circuit 130 may be configured to include a voltage generating circuit (not shown) and a row decoder (not shown).

The voltage generating circuit may generate the operating voltages for a read operation of the memory cells in response to the voltage control signal VCON from the control logic 120. For example, the voltage generating circuit may generate a read voltage to be applied to selected memory cells to perform the read operation, and a pass voltage to be applied to unselected memory cells.

The row decoder may apply the operating voltages generated by the voltage generating circuit to word lines coupled to the selected memory cells and word lines coupled to the unselected memory cells in response to the row address signal RADD from the control logic 120.

The page buffer group 140 may include a plurality of page buffers (not shown) coupled to the memory cell array 110 through the bit lines BL. The plurality of page buffers may be grouped into a plurality of groups. The page buffers of the page buffer group 140 may sense a voltage or a current of the bit lines BL to read data from the memory cells in response to the page buffer control signals PB_CON from the control logic 120. For example, during a read operation, the page buffer group 140 may sense variations in voltage of the bit lines BL and latch data of the memory cells corresponding to results of sensing the variations to the cache latch group 150.

The cache latch group 150 may be coupled to the page buffers of the page buffer group 140 through internal data lines IDL and include a plurality of cache latches (not shown) for latching the data sensed by the page buffers. The cache latches may output the read data to bit out lines BITOUT in response to a column select signal CS<m:0>. The cache latches may respectively correspond to and be coupled to the page buffers.

The sense amplifier group 160 may sense and amplify a voltage of the bit out lines BITOUT in response to a strobe signal IOSTB and Include a plurality of sense amplifiers (not shown) for outputting the sensed data to data lines DL coupled to the input/output circuit 170.

The input/output circuit 170 may receive the command signal CMD and the address signal ADD from an external device and transfer the received command signal CMD and address signal ADD to the control logic 120. In addition, the input/output circuit 170 may output data DATA transferred from the cache latches included in the cache latch group 150 through sense amplifiers included in the sense amplifier group 160 to an external device during a read operation.

The column select signal generation circuit 180 may generate and output the column select signal CS<m:0> for controlling a data output operation of the cache latches in the cache latch group 150 to externally output the read data during the read operation. In addition, the column select signal generation circuit 180 may include a strobe signal generation circuit 181. The strobe signal generation circuit 181 may generate and output the strobe signal IOSTB for controlling a sensing operation of the sense amplifiers in the sense amplifier group 160.

The column select signal generation circuit 180 may be configured to be included in the control logic 120 or may be disposed externally to the control logic 120.

Figure 2:
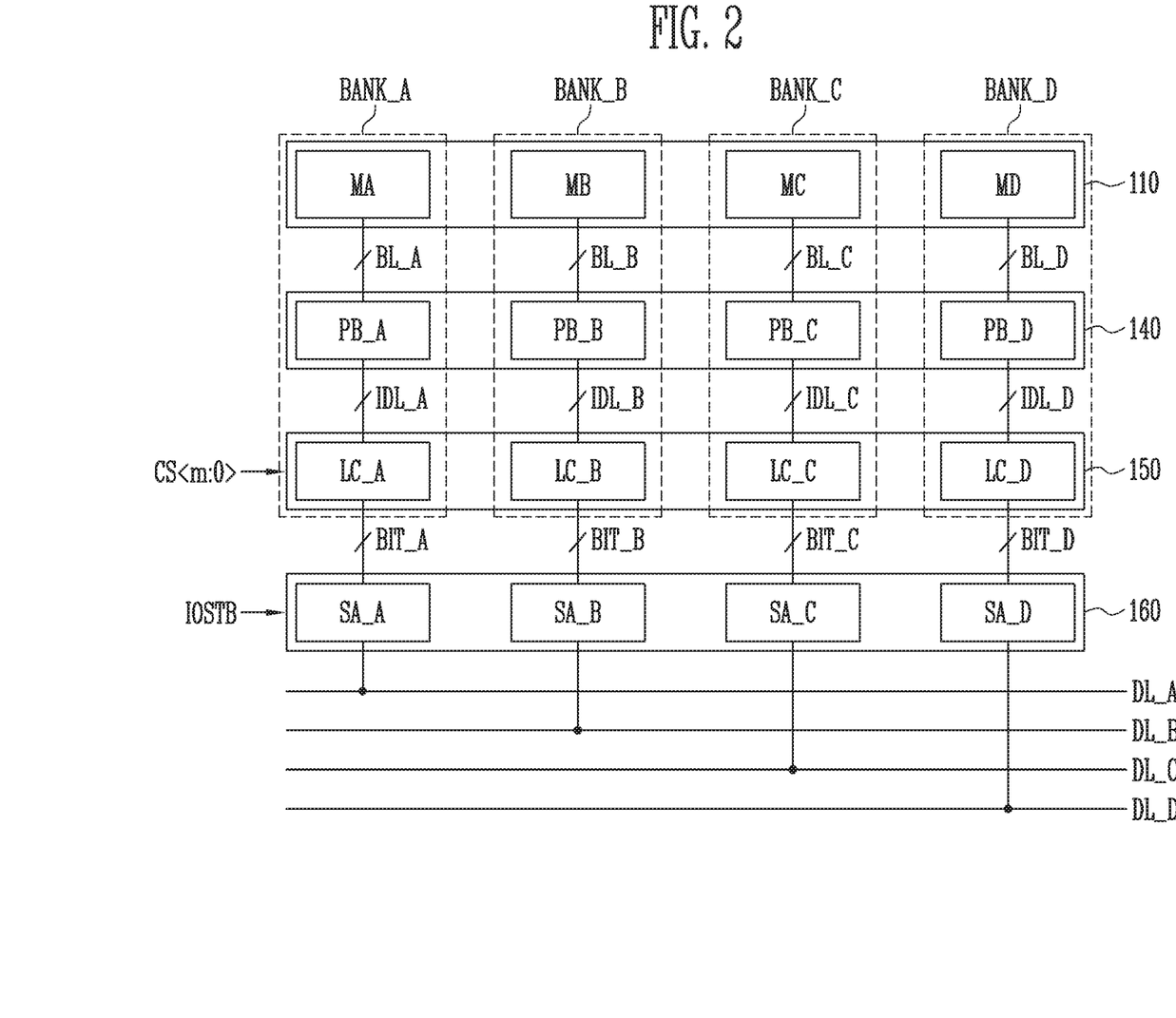
FIG. 2 is a diagram illustrating a coupling relationship of a memory cell array, a page buffer group, a cache latch group, and a sense amplifier group shown in FIG. 1.

FIG. 2 is a diagram illustrating a coupling relationship of the memory cell array 110, the page buffer group 140, the cache latch group 150, and the sense amplifier group 160 shown in FIG. 1.

Referring to FIG. 2, the memory cell array 110 may include a plurality of memory cell groups, e.g., first to fourth memory cell groups MA, MB, MC, and MD, respectively. The page buffer group 140 may include a plurality of buffer groups, e.g., first to fourth buffer groups PB_A, PB_B, PB_C, and PB_D, respectively. The first buffer group PB_A may correspond to the first memory cell group MA and include a plurality of page buffers coupled to the first memory cell group MA through bit lines BL_A. The second buffer group PB_B may correspond to the second memory cell group MB and include a plurality of page buffers coupled to the second memory cell group MB through bit lines BL_B. The third buffer group PB_C may correspond to the third memory cell group MC and include a plurality of page buffers coupled to the third memory cell group MC through bit lines BL_C. The fourth buffer group PB_D may correspond to the fourth memory cell group MD and include a plurality of page buffers coupled to the fourth memory cell group MD through bit lines BL_D.

The cache latch group 150 may include a plurality of latch groups, e.g., first to fourth latch groups LC_A, LC_B, LC_C, and LC_D, respectively. The first latch group LC_A may include a plurality of cache latches. The first latch group LC_A may correspond to the first buffer group PB_A and may be coupled to the first buffer group PB_A through an internal data line IDL_A, which may represent more than one data line. In addition, the first latch group LC_A may be coupled to a plurality of bit out lines BIT_A and transfer data stored in selected cache latches among the plurality of cache latches in the first latch group LC_A to the plurality of bit out lines BIT_A in response to the column select signal CS<m:0>. The second latch group LC_B may include a plurality of cache latches. The second latch group LC_B may correspond to the second buffer group PB_B and may be coupled to the second buffer group PB_B through an internal data line IDL_B, which may represent more than one data line. In addition, the second latch group LC_B may be coupled to a plurality of bit out lines BIT_B and transfer data stored in selected cache latches among the plurality of cache latches in the second latch group LC_B to the plurality of bit out lines BIT_B in response to the column select signal CS<m:0>. The third latch group LC_C may include a plurality of cache latches. The third latch group LC_C may correspond to the third buffer group PB_C and may be coupled to the third buffer group PB_C through an internal data line IDL_C, which may represent more than one data line. In addition, the third latch group LC_C may be coupled to a plurality of bit out lines BIT_C and transfer data stored in selected cache latches among the plurality of cache latches in the third latch group LC_C to the plurality of bit out lines BIT_C in response to the column select signal CS<m:0>. The fourth latch group LC_D may include a plurality of cache latches. The fourth latch group LC_D may correspond to the fourth buffer group PB_D and may be coupled to the fourth buffer group PB_D through an internal data line IDL_D, which may represent more than one data line. In addition, the fourth latch group LC_D may be coupled to a plurality of bit out lines BIT_D and transfer data stored in selected cache latches among the plurality of cache latches in the fourth latch group LC_D to the plurality of bit out lines BIT_D in response to the column select signal CS<m:0>.

The first memory cell group MA, the first buffer group PB_A, and the first latch group LC_A may be defined as one memory bank BANK_A; the second memory cell group MB, the second buffer group PB_B, and the second latch group LC_B may be defined as one memory bank BANK_B; the third memory cell group MC, the third buffer group PB_C, and the third latch group LC_C may be defined as one memory bank BANK_C; and the fourth memory cell group MD, the fourth buffer group PB_D, and the fourth latch group LC_D may be defined as one memory bank BANK_D. According to this embodiment, four memory banks are illustrated. However, the present invention Is not limited thereto and at least one memory bank may be included.

The sense amplifier group 160 may include a plurality of sense amplifiers, e.g., first to fourth sense amplifiers SA_A, SA_B, SA_C, and SA_D, respectively. The first sense amplifier SA_A may be coupled to the plurality of bit out lines BIT_A, sequentially sense potential levels of the plurality of bit out lines BIT_A in response to the strobe signal IOSTB, and transfer results of sensing the potential levels to data line DL_A. The second sense amplifier SA_B may be coupled to the plurality of bit out lines BIT_B, sequentially sense potential levels of the plurality of bit out lines BIT_B in response to the strobe signal IOSTB, and transfer results of sensing the potential levels to data line DL_B. The third sense amplifier SA_C may be coupled to the plurality of bit out lines BIT_C, sequentially sense potential levels of the plurality of bit out lines BIT_C in response to the strobe signal IOSTB, and transfer results of sensing the potential levels to data line DL_C. The fourth sense amplifier SA_D may be coupled to the plurality of bit out lines BIT_D, sequentially sense potential levels of the plurality of bit out lines BIT_D in response to the strobe signal IOSTB, and transfer results of sensing the potential levels to data line DL_D.

According to this embodiment, it is illustrated and described that one sense amplifier corresponds to one memory bank (for example, BANK_A). However, according to another design, at least two sense amplifiers may be disposed to correspond to one memory bank such that a cache operation can be performed during a data output operation to quickly output data of the memory bank to a data line.

Figure 3:
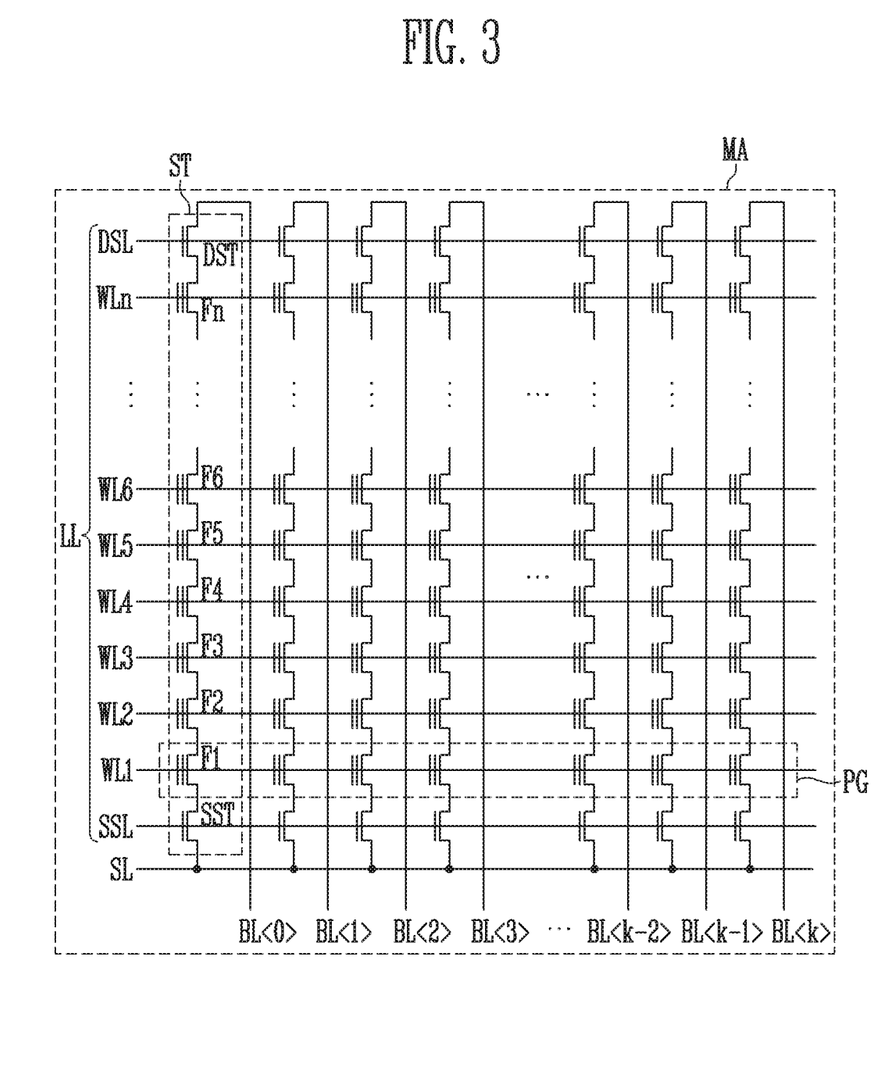
FIG. 3 is a diagram illustrating a first memory cell group shown in FIG. 2.

FIG. 3 is a diagram illustrating the first memory cell group MA shown in FIG. 2.

Since the memory cell array 110 shown in FIG. 2 includes a plurality of memory cell groups, e.g., MA, MB, MC, and MD, each of which have similar structure, the first memory cell group MA is described by way of example.

Referring to FIG. 3, the first memory cell group MA may include a plurality of memory cell strings ST coupled between a plurality of bit lines BL<0> to BL<k> and a source line SL, where k is a positive integer. The plurality of memory cell strings ST may correspond to the plurality of bit lines BL<0> to BL<k>, respectively. Among the memory cell strings ST, one memory cell string ST coupled to one of the bit lines, for example, BL<0> is described as an example as below.

The memory cell string ST may include a source select transistor SST, first to nth memory cells F1 to Fn, and a drain select transistor DST coupled in series between the source line SL and the bit line BL<0>, where n is a positive integer. A gate of the source select transistor SST may be coupled to the source select line SSL, gates of the first to nth memory cells F1 to Fn may be coupled to first to nth word lines WL1 to WLn, respectively, and a gate of the drain select transistor DST may be coupled to the drain select line DSL. The plurality of word lines WL1 to WLn, the source select line SSL, and the drain select line DSL may be defined as the local lines LL. A group of memory cells coupled to different strings ST which share a single word line may be referred to as a page PG. For example, one page may include memory cells having the number corresponding to 8 k Bytes. In addition, each page PG may include a plurality of logical pages according to a method of programming the first to nth memory cells F1 to Fn. For example, multi-level cells MLC may each include two logical pages, triple level cells TLC may each include three logical pages, and quadruple level cells QLC may each include four logical pages. The source select transistor SST, the first to nth memory cells F1 to Fn, and the drain select transistor DST may be stacked on a substrate in a vertical direction to a surface of the substrate. This three-dimensional memory array may reduce an area of a memory device.

The plurality of memory cell strings ST included in the first memory cell group MA may be classified into a main string and a redundancy string. The redundancy string is a string to replace the main string when the failure occurs in the main string.

Figure 4:
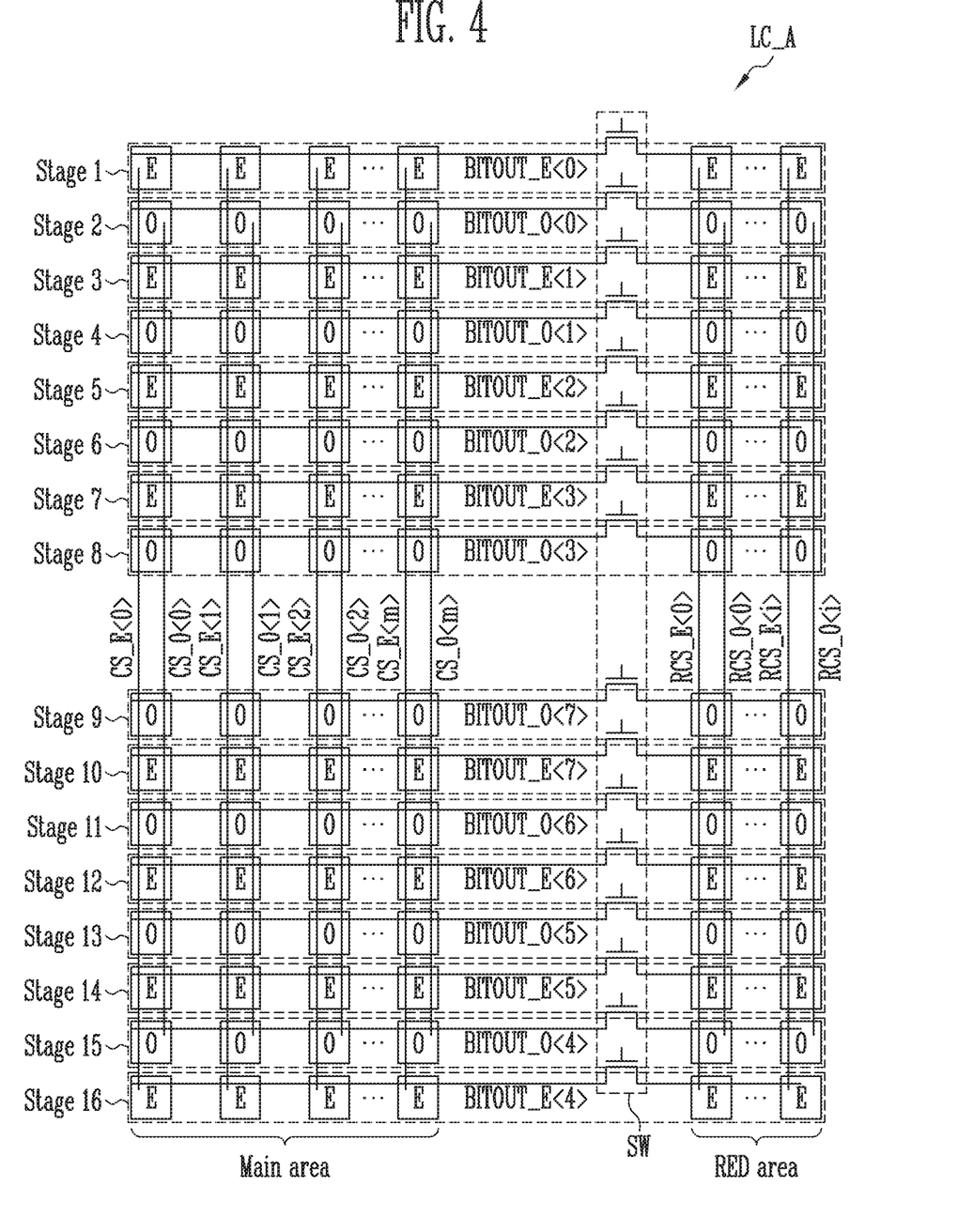
FIG. 4 is a diagram illustrating a first latch group among cache latch groups shown in FIG. 2.

FIG. 4 is a diagram illustrating a first latch group LC_A among the cache latch group 150 shown in FIG. 2.

The cache latch group 150 shown in FIG. 2 may include a plurality of latch groups LC_A, LC_B, LC_C, and LC_D. Since the plurality of latch groups LC_A, LC_B, LC_C, and LC_D have similar structures to each other, the first latch group LC_A Is described by way of example.

Referring to FIG. 4, the first latch group LC_A may include a plurality of latch stages, i.e., first to sixteenth latch stages, Stage 1 to Stage 16. Each latch stage may include a plurality of even latches E or a plurality of odd latches O. Each of the latches (even E and odd O) in each of the latch stages may correspond to a respective one of a plurality of columns of the memory cell array 110 shown in FIG. 2. For example, the even latches E in Stages 1, 3, 5, 7, 10, 12, 14 and 16 may be respectively coupled to the even bit out lines BITOUT_E<7:0>. The odd latches O included in Stages 2, 4, 6, 8, 9, 11, 13 and 15 may be respectively coupled to the odd bit out lines BITOUT_O<7:0>. For reference, the plurality of even bit out lines BITOUT_E<7:0> and the plurality of odd bit out lines BITOUT_O<7:0> of FIG. 4 may correspond to the plurality of bit out lines BIT_A of FIG. 2.

The first to eighth latch stages (Stage 1 to Stage 8) may be defined as an upper latch stage, and the ninth to sixteenth latch stages (Stage 9 to Stage 16) may be defined as a lower latch stage. The lower latch stage may face the upper latch stage and have a shape symmetrical to the upper latch stage.

The first latch stage may include a plurality of even latches E which are coupled to an even bit out line BITOUT_E<0>. In addition, the second latch stage may include a plurality of odd latches O which are coupled to an odd bit out line BITOUT_O<0>. In addition, the seventh latch stage may include a plurality of even latches E which are coupled to an even bit out line BITOUT_E<3>. In addition, the eighth latch stage may include a plurality of odd latches O which are coupled to an odd bit out line BITOUT_O<3>.

The first to eighth latch stages may be sequentially arranged, and the latches in each of these latch stages may be defined as even latches E or odd latches O, according to the arrangement. Some of the first to eighth latch stages may be even latch stages and others may be odd latch stages. For example, Stages 1, 3, 5, and 7 may be defined as even latch stages, and Stages 2, 4, 6, and 8 may be defined as odd latch stages. The even latch stages and the odd latch stages may be alternately arranged with each other.

The ninth latch stage may include a plurality of odd latches O which are coupled to an odd bit out line BITOUT_O<7>. In addition, the tenth latch stage may include a plurality of even latches E which are coupled to an even bit out line BITOUT_E<7>. In addition, the fifteenth latch stage may include a plurality of odd latches O which are coupled to an odd bit out line BITOUT_O<4>. In addition, the sixteenth latch stage may include a plurality of even latches E which are coupled to an even bit out line BITOUT_E<4>.

The ninth to sixteenth latch stages may be sequentially arranged, and the latches in each of these latch stages may be defined as even latches E or odd latches O, according to the arrangement. Some of the ninth to sixteenth latch stages may be even latch stages and others may be odd latch stages. For example, Stages 10, 12, 14, and 16 may be defined as even latch stages, and Stages 9, 11, 13, and 15 may be defined as odd latch stages. The even latch stages and the odd latch stages may be alternately arranged with each other.

Since the upper latch stage and the lower latch stage face each other and are symmetrical to each other, the outermost and last odd latch stage (Stage 8) of the upper latch stage may be arranged to be adjacent to the outermost and first odd latch stage (Stage 9) of the lower latch stage.

Although not illustrated in FIG. 4, a column decoder may be disposed between the upper latch stage and the lower latch stage, with the upper latch stage disposed at one end of the column decoder and the lower latch stage disposed at the other end.

The plurality of latches in each of the first to sixteenth latch stages may transfer data latched in the corresponding even bit out lines BITOUT_E<7:0> or odd bit out lines BITOUT_O<7:0> in response to column select signals CS_E<m:0>, CS_O<m:0>, RCS_E<i:0>, and RCS_O<i:0>. For reference, a pair of even bit out line BITOUT_E<x> and odd bit out line BITOUT_O<x> may be composed of one of the bit out lines BIT_A of FIG. 2, where x is an integer from 0 to 7. The column select signals CS_E<m:0>, CS_O<m:0>, RCS_E<i:0>, and RCS_O<i:0> of FIG. 4 may correspond to the column select signal CS<m:0> of FIG. 2.

Each of even latches E and the plurality of odd latches O in the first to sixteenth latch stages may be part of a main area Main area or a redundancy area RED area. The main area may correspond to main strings in the first memory cell group MA shown in FIG. 3. The main area may read data stored in the main strings, and latch the read data therein. The redundancy area may correspond to redundancy strings of the first memory cell group MA. The redundancy area may read data stored in the redundancy strings, and latch the read data therein. The plurality of even latches E and the plurality of odd latches O in the redundancy area RED area may transfer the data latched in the even bit out lines BITOUT_E<7:0> or the odd bit out lines BITOUT_O<7:0> through a corresponding switch SW. When failure occurs in any of the main strings, a signal for turning on the switch SW corresponding to the defective main string is applied. Thus, by turning on the corresponding switch SW, the redundancy string may replace the defective main string.

As described above, according to an embodiment of the present invention, the first to sixteenth latch stages may be disposed such that bit out lines correspond to the first to sixteenth latch stages in a one-to-one manner. Accordingly, data output operations of the first to sixteenth latch stages may be individually performed. According to this embodiment, the data output operations of the latch stages may be performed more quickly than data output operations of latch stages having a structure in which at least two latch stages share one bit out line.

Figure 5:
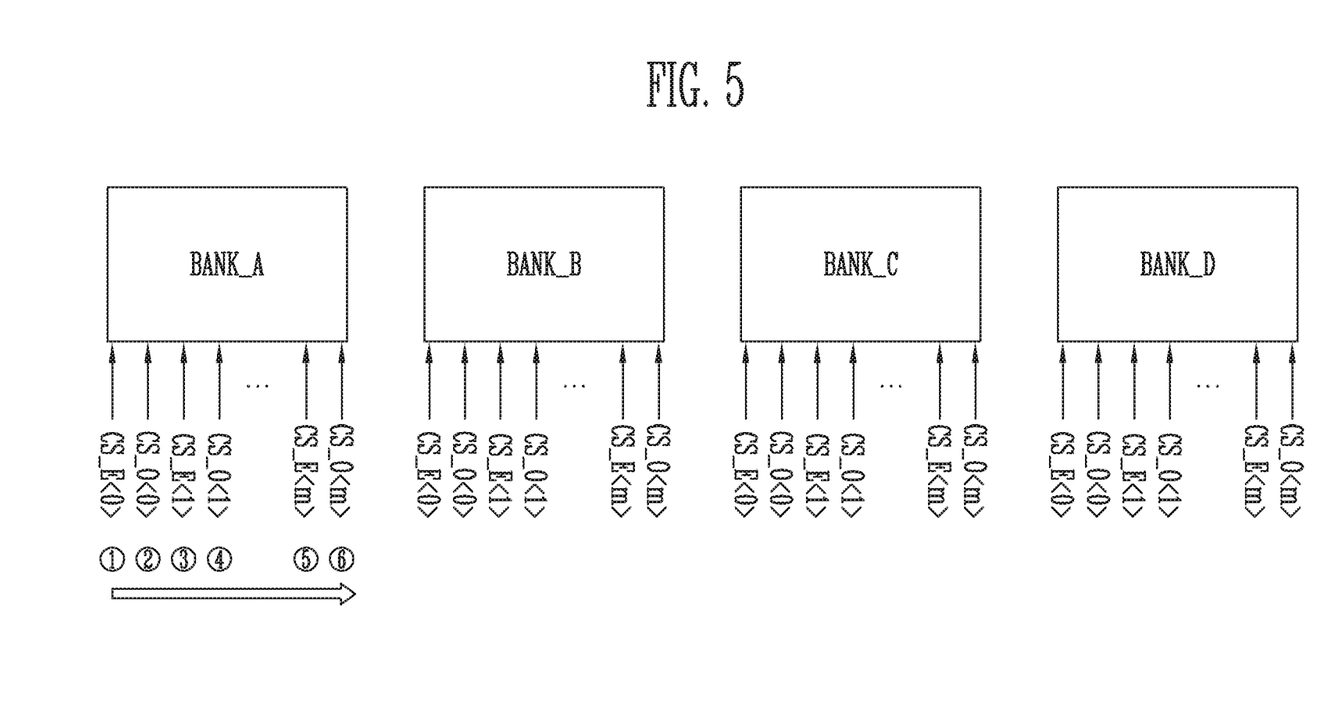
FIG. 5 is a diagram illustrating an order in which column select signals are applied to a plurality of memory banks.

FIG. 5 is a diagram illustrating an order in which column select signals are applied to a plurality of memory banks.

Referring to FIG. 5, the column select signals CS_E<m:0> and CS_O<m:0> may be applied to each of a plurality of memory banks, e.g., BANK_A, BANK_B, BANK_C, and BANK_D. Here, a signal applied to a bank may indicate that the signal is activated and inputted to the bank.

The column select signals CS_E<m:0> corresponding to even columns and the column select signals CS_O<m:0> corresponding to odd columns may be alternately applied. For example, the column select signals CS_E<0> may be firstly applied (①), the column select signals CS_0<0> may be secondly applied (②), the column select signals CS_E<1> may be thirdly applied (③), and the column select signals CS_0<1> may be fourthly applied (④). According to this pattern of alternately applying the column select signals, the column select signals CS_E<m> may be next applied (⑤) and the column select signals CS_O<m> may be lastly applied (⑥). The column select signals CS_E<m:0> may be overlap with the column select signals CS_O<m:0>.

As illustrated in FIG. 4, each of the first to sixteenth latch stages corresponds to one bit out line. Thus, by sequentially applying the plurality of column select signals CS_E<m:0> and CS_O<m:0> in order of columns in each of the first to sixteenth latch stages, the even latches E or the odd latches O at the respective columns are sequentially selected to transfer data to the even bit out lines BITOUT_E<7:0> or the odd bit out lines BITOUT_O<7:0>.

The plurality of column select signals CS_E<m:0> and CS_O<m:0> may be sequentially applied to each of memory banks BANK_A, BANK_B, BANK_C, and BANK_D.

Figure 6:
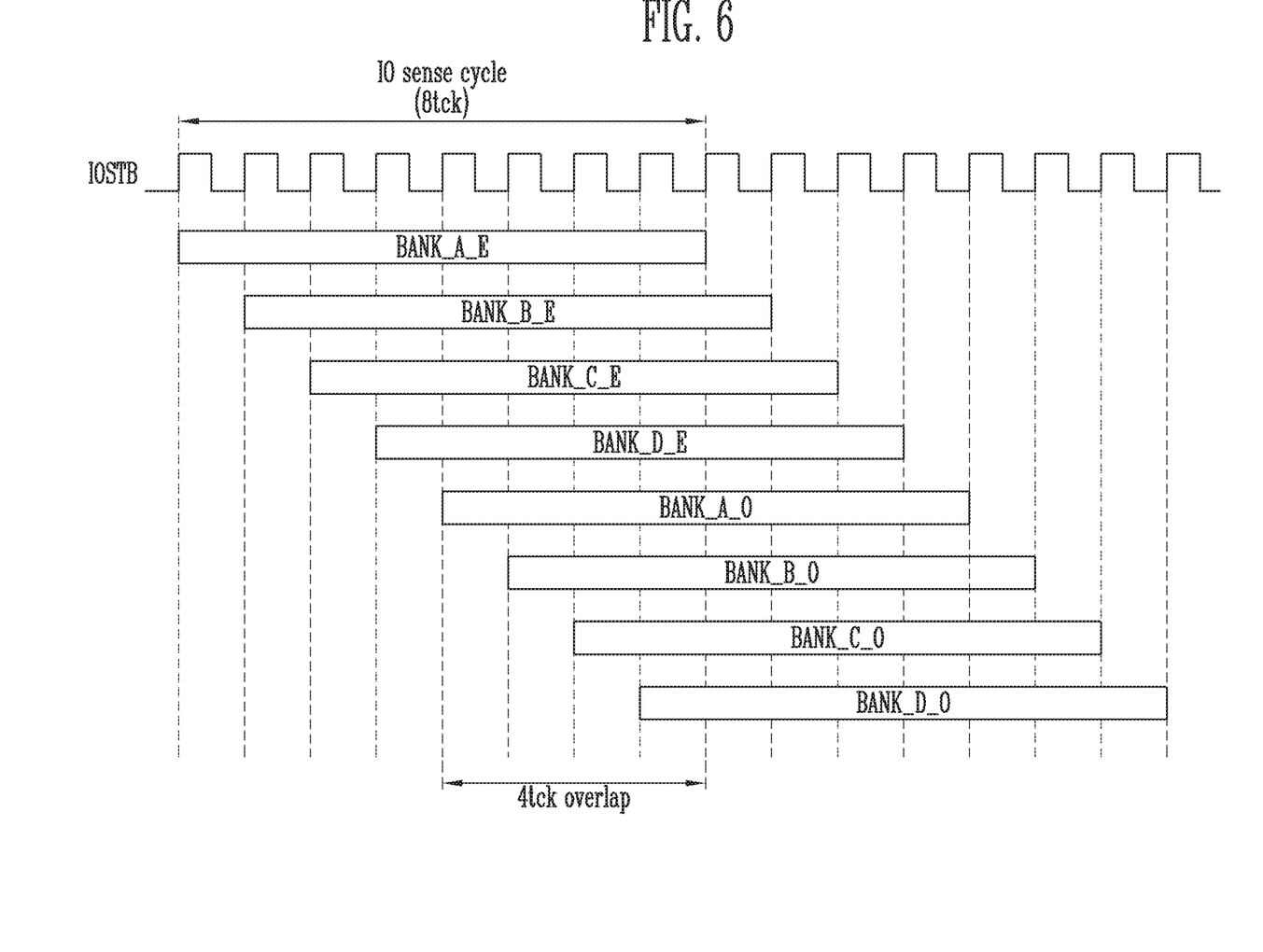
FIG. 6 is a timing diagram illustrating a data output operation according to an embodiment of the present invention.

FIG. 6 is a timing diagram illustrating a data output operation according to an embodiment of the present Invention.

A data output operation of a semiconductor memory device according to an embodiment of the present invention is described below with reference to FIGS. 1 to 6.

The control logic 120 may output the voltage control signal VCON to generate the operating voltages to perform a read operation in response to the command signal CMD input from an external device through the input/output circuit 170. The control logic 120 may output the page buffer control signal PB_CON to control page buffers included in the page buffer group 140.

The voltage supply circuit 130 may generate the operating voltages (for example, a read voltage and a pass voltage) for a read operation of the memory cells in response to the voltage control signal VCON from the control logic 120, and supply the operating voltages to the memory cell array 110.

The page buffer group 140 may sense a voltage or a current of the bit lines BL coupled to the memory cell array 110. For example, during a read operation, the page buffer group 140 may sense variations in voltage of the bit lines BL and latch data of the memory cells corresponding to results of sensing the variations in the cache latch group 150.

The data latched in the cache latch group 150 may be output through the bit out line BITOUT and the sense amplifier group 160 may sense a potential of the bit out line BITOUT and output the sensed data through the data lines DL coupled to the input/output circuit 170. The input/output circuit 170 may output the data DATA received through the data lines DL to an external device.

A data output operation of the cache latch group 150 through the bit out line BITOUT and a sensing operation of the sense amplifier group is described below in more detail.

Data stored in the first latch group LC_A corresponding to the memory bank BANK_A may be output through the plurality of bit out lines BIT_A including the even bit out lines BITOUT_E<7:0> and the odd bit out lines BITOUT_O<7:0>, in response to the column select signal CS<m:0>, i.e., CS_E<m:0> and CS_O<m:0>.

The column select signals CS_E<m:0> corresponding to even columns and the column select signals CS_O<m:0> corresponding to odd columns may be alternately applied. The plurality of column select signals CS_E<m:0> and CS_O<m:0> may be sequentially applied to each of the plurality memory banks, e.g., BANK_A, BANK_B, BANK_C, and BANK_D.

For example, the column select signal CS_E<0> may be applied to the even latch stages (Stages 1, 3, 5, 7, 10, 12, 14, and 16) of the memory bank BANK_A. Even data BANK_A_E stored in the even latch E receiving the column select signal CS_E<0>, among the plurality of even latches E in each of the even latch stages, may be output to the even bit out lines BITOUT_E<7:0>.

Subsequently, the column select signal CS_E<0> may be applied to the even latch stages of the memory bank BANK_B. Even data BANK_B_E stored in the even latch E receiving the column select signal CS_E<0>, among the plurality of even latches E included in each of the even latch stages, may be output to the even bit out lines BITOUT_E<7:0>.

Subsequently, the column select signal CS_E<0> may be applied to the even latch stages Stage 1, Stage 3, Stage 5, Stage 7, Stage 10, Stage 12, Stage 14, and Stage 16 of the memory bank BANK_C. Even data BANK_C_E stored in the even latch E receiving the column select signal CS_E<0>, among the plurality of even latches E, may be output to the even bit out lines BITOUT_E<7:0>.

Subsequently, the column select signal CS_E<0> may be applied to the even latch stages of the memory bank BANK_D. Even data BANK_D_E stored in the even latch E receiving the column select signal CS_E<0>, among the plurality of even latches E, may be output to the even bit out lines BITOUT_E<7:0>.

Subsequently, the column select signal CS_0<0> may be applied to the odd latch stages (Stages 2, 4, 6, 8, 9, 11, 13, and 15) of the memory bank BANK_A. Odd data BANK_A_O stored in the odd latch O receiving the column select signal CS_0<0>, among the plurality of odd latches O in each of the odd latch stages, may be output to the odd bit out lines BITOUT_O<7:0>.

Subsequently, the column select signal CS_0<0> may be applied to the odd latch stages (Stages 2, 4, 6, 8, 9, 11, 13, and 15) of the memory bank BANK_B. Odd data BANK_B_0 stored in the odd latch O receiving the column select signal CS_0<0>, among the plurality of odd latches O in each of the odd latch stages, may be output to the odd bit out lines BITOUT_O<7:0>.

Subsequently, the column select signal CS_0<0> may be applied to the odd latch stages (Stage 2, 4, 6, 8, 9, 11, 13, and 15) of the memory bank BANK_C. Odd data BANK_C_O stored in the odd latch O receiving the column select signal CS_0<0>, among the plurality of odd latches O in each of the odd latch stages, may be output to the odd bit out lines BITOUT_O<7:0>.

Subsequently, the column select signal CS_0<0> may be applied to the odd latch stages (Stages 2, 4, 6, 8, 9, 11, 13, and 15) of the memory bank BANK_D. Odd data BANK_D_O stored in the odd latch O receiving the column select signal CS_0<0>, among the plurality of odd latches O in each of the odd latch stages, may be output to the odd bit out lines BITOUT_O<7:0>.

As described above, the even latch stages (Stage 1, Stage 3, Stage 5, Stage 7, Stage 10, Stage 12, Stage 14, and Stage 16), and the odd latch stages (Stage 2, Stage 4, Stage 6, Stage 8, Stage 9, Stage 11, Stage 13, and Stage 15) perform the data output operations of outputting the data to different bit out lines. Thus, a first data output operation of outputting the even data (BANK_A_E, BANK_B_E, BANK_C_E, and BANK_D_E) to the even bit out lines BITOUT_E<7:0> and a second data output operation of outputting the odd data (BANK_A_O, BANK_B_O, BANK_C_O, and BANK_D_O) to the odd bit out lines BITOUT_O<7:0> are performed to partially overlap each other during an overlap period of, for example, four (4) cycles (4tck), as shown in FIG. 6. In other words, the first data output operation of outputting the odd data of the odd latch stages (Stage 2, Stage 4, Stage 6, Stage 8, Stage 9, Stage 11, Stage 13, and Stage 15) do not start after the second data output operation of outputting the even data of the even latch stages (Stage 1, Stage 3, Stage 5, Stage 7, Stage 10, Stage 12, Stage 14, and Stage 16) are completed, but the first data output operation may start during the second data output operation. Accordingly, since a time for transferring data in the data output operation from the cache latch group 150 to the bit out lines BITOUT may be sufficiently secured, the stability of the data output operation may be improved and the time for the data output operation may be reduced as much as the overlapped period (e.g., 4tck).

The first to fourth sense amplifiers SA_A, SA_B, SA_C, and SA_D may correspond to the memory banks BANK_A, BANK_B, BANK_C, and BANK_D, respectively, and the respective sense amplifiers SA_A, SA_B, SA_C, and SA_D may sequentially sense potential levels of the plurality of even bit out lines BITOUT_E<7:0> and the plurality of odd bit out lines BITOUT_O<7:0> in response to the strobe signal IOSTB, and transfer the results of sensing the potential levels to their corresponding data line among the data lines DL_A, DL_B, DL_C, and DL_D. FIG. 6 illustrates a transfer cycle IO sense cycle in which sixteen bit out lines BITOUT_E<7:0> and BITOUT_O<7:0> are sensed and the results of sensing the bit out lines are transferred to the data lines DL_A while the strobe signal IOSTB is toggled eight times (8tck).

Figure 7:
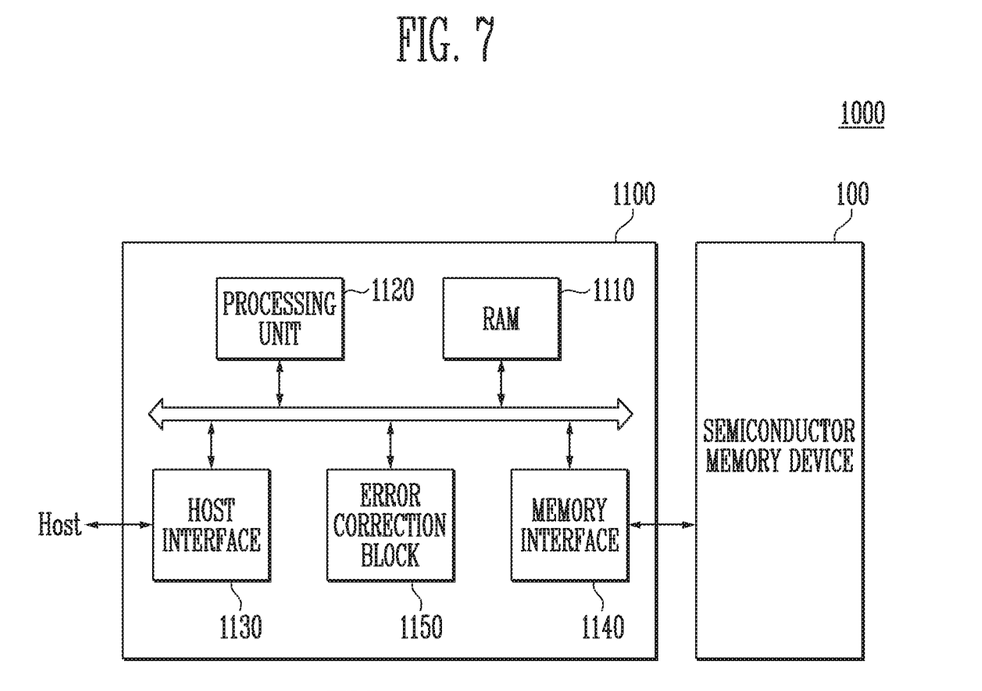
FIG. 7 is a block diagram illustrating a memory system including a semiconductor memory device, such as that shown in FIG. 1.

FIG. 7 is a block diagram illustrating a memory system 1000 including the semiconductor memory device 100 shown in FIG. 1.

Referring to FIG. 7, the memory system 1000 may include the semiconductor memory device 100 and a controller 1100.

The semiconductor memory device 100 may be configured and operated in substantially the same manner as described above with reference to FIG. 1.

The controller 1100 may be coupled to a host (Host) and the semiconductor memory device 100. The controller 1100 may be configured to access the semiconductor memory device 100 in response to a request from the host. For example, the controller 1100 may control a read operation, a write operation, an erase operation, and/or a background operation of the semiconductor memory device 100. The controller 1100 may be configured to provide an interface between the semiconductor memory device 100 and the host. The controller 1100 may be configured to drive firmware for controlling the semiconductor memory device 100.

The controller 1100 may include Random Access Memory (RAM) 1110, a processor 1120, a host interface 1130, a memory interface 1140, and an error correction block 1150. The RAM 1110 may be used as at least one of an operation memory of the processing unit 1120, a cache memory between the semiconductor memory device 100 and the host and a buffer memory between the semiconductor memory device 100 and the host. The processing unit 1120 may control general operations of the controller 1100. In addition, the controller 1100 may temporarily store program data provided form the host during a write operation.

The host interface 1130 may include a protocol for exchanging data between the host and the controller 1100. For example, the controller 1100 may communicate with the host through one or more various interface protocols, such as a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and/or a private protocol.

The memory interface 1140 may interface with the semiconductor memory device 100. For example, the memory interface includes a NAND interface or a NOR interface.

The error correction block 1150 may use an Error Correcting Code (ECC) to detect and correct an error in data received from the semiconductor memory device 100. The processor 1120 may control a read voltage according to an error detection result of the error correction block 1150 and control the semiconductor memory device 100 to perform a read operation again. According to an exemplary embodiment, the error correction block 1150 may be provided as one of the components of the controller 1100.

The controller 1100 and the semiconductor memory device 100 may be integrated into a single semiconductor device. In an embodiment, the controller 1100 and the semiconductor memory device 100 may be integrated into a single semiconductor device to constitute a memory card, such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into a single semiconductor device to form a semiconductor drive (Solid State Drive (SSD)). The semiconductor drive (SSD) may include a storage device configured to store data in a semiconductor memory. When the memory system 1000 is used as a semiconductor drive (SSD), operational rates of the host coupled to the memory system 1000 may be significantly improved.

In another example, the memory system 1000 may be provided as one of various elements of an electronic device, such as a computer, an Ultra Mobile PC (UMPC), a workstation, a net-book, Personal Digital Assistants (PDAs), a portable computer, a web tablet, a wireless phone, a mobile phone, a smartphone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an embodiment, the semiconductor memory device 100 or the memory system 1000 may be embedded in packages in various forms. For example, the semiconductor memory device 100 or the memory system 1000 may be embedded in any of various packages, such as a Package on Package (PoP), Ball grid arrays (BGAs), Chip scale packages (CSPs), a Plastic Leaded Chip Carrier (PLCC), a Plastic Dual In Line Package (PDIP), a Die in Waffle Pack, a Die in Wafer Form, a Chip On Board (COB), a Ceramic Dual In Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a System In Package (SIP), a Multi Chip Package (MCP), a Wafer-level Fabricated Package (WFP), a Wafer-Level Processed Stack Package (WSP), or the like.

Figure 8:
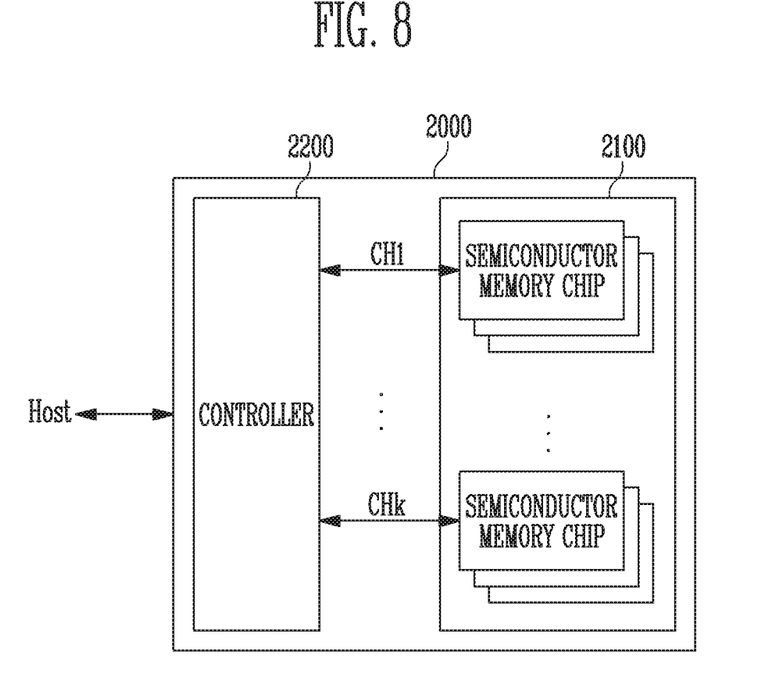
FIG. 8 is a block diagram illustrating an application example of a memory system, such as that shown in FIG. 7.

FIG. 8 is a block diagram illustrating an application example of the memory system shown in FIG. 7.

Referring to FIG. 8, a memory system 2000 may include a semiconductor memory device 2100 and a controller 2200. The semiconductor memory device 2100 may include a plurality of semiconductor memory chips. The plurality of semiconductor memory chips may be divided into a plurality of groups.

FIG. 8 illustrates that the plurality of, e.g., k, groups communicate with the controller 2200 through first to kth channels CH1 to CHk, respectively. Each of the semiconductor memory chips may be configured and operated in substantially the same manner as the semiconductor memory device 100 described above with reference to FIG. 1.

Each group may be configured to communicate with the controller 2200 through a single common channel. The controller 2200 may be configured in substantially the same manner as the controller 1100 described with reference to FIG. 7, and configured to control the plurality of memory chips of the semiconductor memory device 2100 through the plurality of channels CH1 to CHk.

Figure 9:
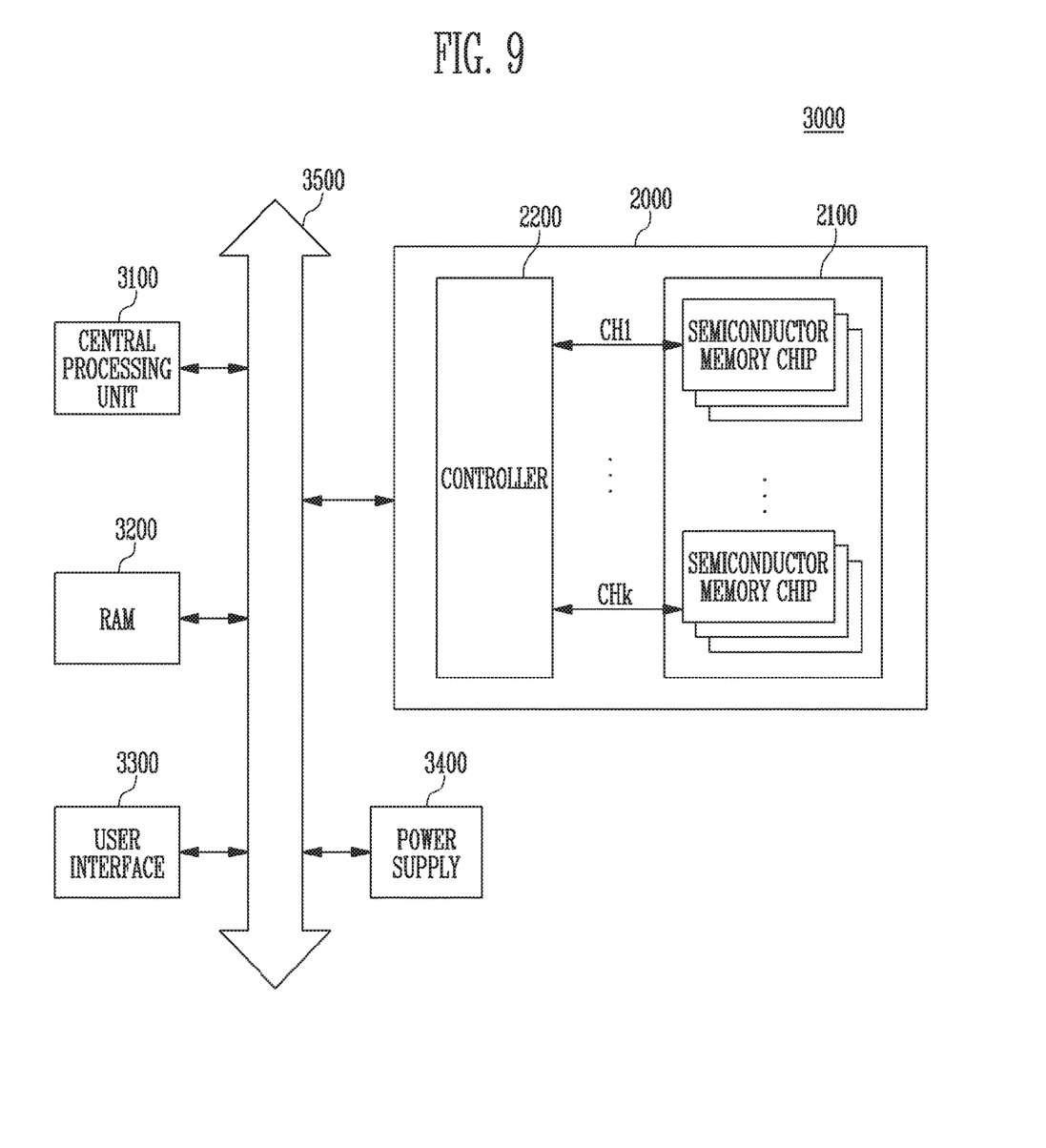
FIG. 9 is a block diagram illustrating a computing system including a memory system, such as that described with reference to FIG. 8.

FIG. 9 is a block diagram illustrating a computing system 3000 including the memory system 2000 described with reference to FIG. 8.

Referring to FIG. 9, the computing system 3000 may include a central processing unit (CPU) 3100, Random Access Memory (RAM) 3200, a user interface 3300, a power supply 3400, a system bus 3500, and the memory system 2000.

The memory system 2000 may be electrically connected to the CPU 3100, the RAM 3200, the user interface 3300, and the power supply 3400 through the system bus 3500. Data provided through the user Interface 3300 or data processed by the CPU 3100 may be stored in the memory system 2000.

FIG. 9 illustrates that the semiconductor memory device 2100 is coupled to the system bus 3500 through the controller 2200. However, the semiconductor memory device 2100 may be directly coupled to the system bus 3500. The functions of the controller 2200 may be performed by the CPU 3100 and the RAM 3200.

Referring to FIG. 9, the memory system 2000 described with reference to FIG. 8 or the memory system 1000 described with reference to FIG. 7 may be provided. According to an embodiment, the computing system 3000 may include both of the memory systems 1000 and 2000 described with reference to FIGS. 7 and 8, respectively.

As described above, according to embodiments of the present disclosure, data operation performance may be improved by grouping a plurality of cache latches in a cache latch group into a plurality of even cache groups and a plurality of odd cache groups, and disposing bit out lines corresponding to the plurality of even cache groups and the plurality of odd cache groups, respectively, such that a data output operation of the even cache groups overlaps a data output operation of the odd cache groups.

It will be apparent to those skilled in the art that various modifications can be made to the above-described embodiments of the present invention without departing from the spirit or scope of the invention. Thus, it is intended that the present invention cover all such modifications provided they come within the scope of the appended claims and their equivalents.

Although the present invention is described and illustrated in the context of various embodiments, the present invention is not limited to these embodiments. Rather, the present invention encompasses other embodiments, which may be variations or modifications of any of the embodiments described above.

In the above-discussed embodiments, one or more steps may be selectively performed or combined with other steps, and in some cases may be skipped. In addition, all steps need not necessarily be performed in the described order.

Furthermore, the embodiments disclosed in the present specification and the drawings are provided to help those with ordinary knowledge in this art more clearly understand the present disclosure rather than to limit the bounds of the present invention. In other words, one of ordinary skill in the art to which the present disclosure belongs will be able to easily understand that various modifications are possible based on the technical scope of the present disclosure.

Moreover, specific terms or words used in the description should be construed in accordance with the spirit of the present invention without limiting the subject matter thereof. It should be understood that many variations and modifications of the basic inventive concept described herein will still fall within the spirit and scope of the present invention as defined in the accompanying claims and equivalents thereof.

What is claimed is:

1. A semiconductor memory device, comprising:
    a cache latch group including a plurality of even latch stages and a plurality of odd latch stages arranged alternately with each other; and
    a sense amplifier group coupled to the cache latch group through a plurality of first bit out lines respectively corresponding to the plurality of even latch stages and through a plurality of second bit out lines respectively corresponding to the plurality of odd latch stages.

2. The semiconductor memory device of claim 1, wherein the plurality of even latch stages transfer data stored in the plurality of even latch stages in response to a plurality of even column select signals and the plurality of odd latch stages transfer data stored in the plurality of odd latch stages in response to a plurality of odd column select signals, and
wherein the even column select signals overlap with the odd column select signals to be activated.

3. The semiconductor memory device of claim 2, wherein a first data output operation in which the data stored in the plurality of even latch stages are output to the plurality of first bit out lines overlaps with a second data output operation in which the data stored in the plurality of odd latch stages are output to the plurality of second bit out lines.

4. The semiconductor memory device of claim 1, wherein the sense amplifier group includes:
first sense amplifiers coupled to the first bit out lines; and
second sense amplifiers coupled to the second bit out lines.

5. The semiconductor memory device of claim 1, wherein the cache latch group includes an upper latch stage that includes a first subset of the plurality of even latch stages and the plurality of odd latch stages and a lower latch stage that includes a second subset of the plurality of even latch stages and the plurality of odd latch stages, and the lower latch stage is disposed adjacent and symmetrically to the upper latch stage.

6. The semiconductor memory device of claim 5, wherein each of the upper latch stage and the lower latch stage includes the plurality of even latch stages and the plurality of odd latch stages arranged alternately with each other.

7. The semiconductor memory device of claim 6, wherein a last odd latch stage disposed at an edge of the upper latch stage is adjacent to a first odd latch stage disposed at an edge of the lower latch stage.

8. The semiconductor memory device of claim 1, wherein each of the plurality of even latch stages includes a plurality of even latches and each of the plurality of odd latch stages includes a plurality of odd latches.

9. A semiconductor memory device, comprising:
a memory cell array including a plurality of memory cell groups;
a page buffer group configured to sense data stored in the plurality of memory cell groups;
a cache latch group configured to latch the data sensed by the page buffer group, the cache latch group including a plurality of even latch stages and a plurality of odd latch stages; and
a sense amplifier group coupled to the cache latch group through a plurality of first bit out lines respectively corresponding to the plurality of even latch stages and through a plurality of second bit out lines respectively corresponding to the plurality of odd latch stages, and configured to sense potentials of the plurality of first bit out lines and the plurality of second bit out lines and transfer sensed data to data lines.

10. The semiconductor memory device of claim 9, wherein the cache latch group latches the data sensed by the page buffer group during a read operation, and outputs the latched data to the plurality of first bit out lines and the plurality of second bit out lines, and
wherein a first data output operation in which even data stored in the plurality of even latch stages are transferred to the plurality of first bit out lines partially overlaps a second data output operation in which odd data stored in the plurality of odd latch stages are transferred to the plurality of second bit out lines.

11. The semiconductor memory device of claim 9, wherein the plurality of even latch stages and the plurality of odd latch stages are arranged alternately with each other.

12. The semiconductor memory device of claim 9, wherein each of the plurality of even latch stages and the plurality of odd latch stages includes a plurality of even latches or a plurality of odd latches.

13. The semiconductor memory device of claim 12, wherein the cache latch group outputs the latched data to the plurality of first bit out lines and the plurality of second bit out lines in response to a plurality of even column select signals and a plurality of odd column select signals.

14. The semiconductor memory device of claim 13, wherein the plurality of even column select signals and the plurality of odd column select signals are applied alternately with each other to the cache latch group.

15. A semiconductor memory device, comprising:
a plurality of memory banks; and
a sense amplifier group configured to sense potential levels of a plurality of bit out lines that are coupled to the memory banks and transfer sensed data to data lines,
wherein each of the plurality of memory banks includes a cache latch group including a plurality of even latch stages and a plurality of odd latch stages, wherein each of the plurality of even latch stages and the plurality of odd latch stages corresponds to a respective one of the plurality of bit out lines, and
wherein a first data output operation of even data stored in the even latch stages overlaps with a second data output operation of odd data stored in the odd latch stages.

16. The semiconductor memory device of claim 15, wherein the plurality of bit out lines include:
a plurality of first bit out lines coupled to the plurality of even latch stages in a one-to-one manner; and
a plurality of second bit out lines coupled to the plurality of odd latch stages in a one-to-one manner.

17. The semiconductor memory device of claim 15, wherein the plurality of even latch stages and the plurality of odd latch stages are arranged alternately with each other.

18. The semiconductor memory device of claim 15, wherein the cache latch group outputs the even data and the odd data to the plurality of bit out lines in response to a plurality of even column select signals and a plurality of odd column select signals.

19. The semiconductor memory device of claim 18, wherein the plurality of even column select signals and the plurality of odd column select signals are applied alternately with each other to the cache latch group.

* * * * *